US009869753B2

(12) United States Patent
Eldada

(10) Patent No.: US 9,869,753 B2
(45) Date of Patent: Jan. 16, 2018

(54) THREE-DIMENSIONAL-MAPPING TWO-DIMENSIONAL-SCANNING LIDAR BASED ON ONE-DIMENSIONAL-STEERING OPTICAL PHASED ARRAYS AND METHOD OF USING SAME

(71) Applicant: QUANERGY SYSTEMS, INC., Sunnyvale, CA (US)

(72) Inventor: Louay Eldada, Sunnyvale, CA (US)

(73) Assignee: Quanergy Systems, Inc., Sunnyvale, CA (US)

( * ) Notice: Subject to any disclaimer, the term of this patent is extended or adjusted under 35 U.S.C. 154(b) by 0 days.

(21) Appl. No.: 14/460,369

(22) Filed: Aug. 15, 2014

(65) Prior Publication Data

US 2016/0049765 A1 Feb. 18, 2016

(51) Int. Cl.

*G01S 7/48* (2006.01)
*G01S 7/481* (2006.01)
*G01S 17/89* (2006.01)
*G01S 17/10* (2006.01)
*H01S 5/00* (2006.01)

(52) U.S. Cl.

CPC ............ *G01S 7/4814* (2013.01); *G01S 17/10* (2013.01); *G01S 17/89* (2013.01); *G01S 7/4815* (2013.01); *H01S 5/0071* (2013.01)

(58) Field of Classification Search

CPC .... A61B 6/03; G01C 3/08; G01N 2021/1787; G01N 21/17; G01B 9/02069
USPC ................................................ 356/3.01–5.15
See application file for complete search history.

(56) References Cited

U.S. PATENT DOCUMENTS 3,781,552 A 12/1973 Kadrmas
5,132,843 A 7/1992 Aoyama et al.
5,210,586 A 5/1993 Grage
5,455,669 A 10/1995 Wetteborn
5,543,805 A 8/1996 Thaniyavarn
5,552,893 A 9/1996 Akasu
5,682,229 A 10/1997 Wangler
5,898,483 A 4/1999 Flowers
6,891,987 B2 5/2005 Ionov et al.
7,746,449 B2 6/2010 Ray et al.
7,969,558 B2 6/2011 Hall
8,125,367 B2 2/2012 Ludwig
8,203,115 B2 6/2012 Hochberg et al.
8,311,374 B2 11/2012 Hochberg et al.
8,731,247 B2 5/2014 Pollock
8,836,922 B1 9/2014 Pennecot et al.
8,988,754 B2 3/2015 Sun et al.
9,014,903 B1 4/2015 Zhu
9,069,080 B2 6/2015 Stettner et al.
9,104,086 B1 8/2015 Davids et al.
(Continued)

OTHER PUBLICATIONS

Guo et al., "INP Photonic Integrated Circuit for 2D Optical Beam Steering", Photonics Conference, Oct. 9-13, 2011, Arlington, VA, IEEE, 2011, 3 pgs.
(Continued)

*Primary Examiner* — Luke D Ratcliffe

(57) ABSTRACT

A plurality of one-dimensional planar beam forming and steering optical phased array chips form a two-dimensional-scanning solid-state lidar, enabling manufacturing of three-dimensional mapping time-of-flight lidars at high yield and low cost resulting from the simplicity of said one-dimensional optical phased array chips.

6 Claims, 2 Drawing Sheets

30
20
10

(56) References Cited

U.S. PATENT DOCUMENTS

| | | | |
|---|---|---|---|
| 9,383,753 | B1 | 7/2016 | Templeton et al. |
| 2005/0033497 | A1 | 2/2005 | Stopczynski |
| 2006/0091303 | A1 | 5/2006 | Evans |
| 2006/0197936 | A1 | 9/2006 | Liebman et al. |
| 2006/0239688 | A1* | 10/2006 | Hillis .................... B82Y 20/00 398/116 |
| 2007/0052947 | A1 | 3/2007 | Ludwig et al. |
| 2007/0181810 | A1 | 8/2007 | Tan et al. |
| 2008/0094607 | A1* | 4/2008 | Bernard .................. G01S 17/46 356/4.07 |
| 2008/0186470 | A1 | 8/2008 | Hipp |
| 2008/0204699 | A1 | 8/2008 | Benz et al. |
| 2008/0227292 | A1 | 9/2008 | Miki |
| 2009/0059201 | A1 | 3/2009 | Willner et al. |
| 2009/0251680 | A1 | 10/2009 | Farsaie |
| 2009/0278030 | A1 | 11/2009 | Deliwala |
| 2010/0045964 | A1 | 2/2010 | Jin et al. |
| 2010/0187402 | A1 | 7/2010 | Hochberg et al. |
| 2010/0187442 | A1 | 7/2010 | Hochberg et al. |
| 2010/0253585 | A1 | 10/2010 | Llorens del Rio et al. |
| 2010/0271614 | A1 | 10/2010 | Albuquerque et al. |
| 2010/0290029 | A1 | 11/2010 | Hata |
| 2011/0216304 | A1 | 9/2011 | Hall |
| 2011/0222814 | A1 | 9/2011 | Krill et al. |
| 2011/0255070 | A1 | 10/2011 | Phillips et al. |
| 2011/0316978 | A1 | 12/2011 | Dillon et al. |
| 2012/0013962 | A1 | 1/2012 | Subbaraman et al. |
| 2012/0226118 | A1 | 9/2012 | Delbeke et al. |
| 2012/0286136 | A1 | 11/2012 | Krill et al. |
| 2013/0027715 | A1 | 1/2013 | Imaki et al. |
| 2013/0044309 | A1 | 2/2013 | Dakin et al. |
| 2013/0114924 | A1 | 5/2013 | Loh et al. |
| 2013/0127980 | A1 | 5/2013 | Haddick et al. |
| 2013/0208256 | A1 | 8/2013 | Mamidipudi et al. |
| 2013/0242400 | A1 | 9/2013 | Chen |
| 2013/0301976 | A1 | 11/2013 | Saida et al. |
| 2014/0152871 | A1 | 6/2014 | Campbell |
| 2014/0211194 | A1 | 7/2014 | Pacala |
| 2014/0240691 | A1 | 8/2014 | Mheen |
| 2014/0376001 | A1* | 12/2014 | Swanson ............. A61B 5/0066 356/479 |
| 2015/0192677 | A1 | 7/2015 | Yu |
| 2015/0293224 | A1 | 10/2015 | Eldada |
| 2015/0346340 | A1 | 12/2015 | Yaacobi et al. |
| 2015/0378241 | A1 | 12/2015 | Eldada |
| 2016/0047901 | A1 | 2/2016 | Pacala |
| 2016/0161600 | A1 | 6/2016 | Eldada |

OTHER PUBLICATIONS

International Search Report and Written Opinion issued to International Patent Application No. PCT/US15/44069, dated Nov. 12, 2015, 9 pgs.

Guo et al., "Two-Dimensional optical Beam Steering with InP-Based Photonic Integrated Circuits", IEEE Journal of Selected Topics in Quantum Electronics, vol. 19, No. 4, Aug. 2013, pp. 1, 6, 8, 11.

Hulme et al., "Fully Integrated Hybrid Silicon Free-Space Beam Steering Source with 32 Channel Phased Array", SPIE, Mar. 26, 2014, pp. 898907-2, 898907-13.

Taillaert et al., "An Out-Of-Plane Grating Coupler for Efficient Butt-Coupling Between Compact Planar Waveguides and Single-Mode Fibers", IEEE Journal of Quantum Electronics, vol. 38, No. 7, Jul. 2002, pp. 951-953.

Van Acoleyen, Karel, "Nanophotonic Beamsteering Elements Using Silicon Technology for Wireless Optical Applications", Ghent University, Dept. of Information Technology, Aug. 27, 2012, 180 pgs.

Van Acoleyen; Karel, "Off-Chip Beam Steering with a One-Dimensional Optical Phased Array on Silicon-On-Insulator", Optics Letters, vol. 34, No. 9, May 1, 2009, pp. 1477-1479.

International Search Report and Written Opinion issued to international patent application No. PCT/US15/56516, Feb. 4, 2016, 7 pgs.

* cited by examiner

THREE-DIMENSIONAL-MAPPING TWO-DIMENSIONAL-SCANNING LIDAR BASED ON ONE-DIMENSIONAL-STEERING OPTICAL PHASED ARRAYS AND METHOD OF USING SAME

REFERENCES CITED

| U.S. Patent Documents | | |
|---|---|---|
| 7,339,727 B1 | March 2008 | Rothenberg |
| 7,406,220 B1 | July 2008 | Christensen |
| 7,428,100 B2 | September 2008 | Smith |
| 7,436,588 B2 | October 2008 | Rothenberg |
| 7,489,870 B2 | February 2009 | Hillis |
| 7,532,311 B2 | May 2009 | Henderson |
| 7,555,217 B2 | July 2009 | Hillis |

FIELD OF THE INVENTION

The present invention relates generally to the field of environment sensing, and more particularly to the use of Time of Flight (ToF) lidar sensors for real-time three-dimensional mapping and object detection, tracking, identification and/or classification.

BACKGROUND OF THE INVENTION

A lidar sensor is a light detection and ranging sensor. It is an optical remote sensing module that can measure the distance to a target or objects in a scene, by irradiating the target or scene with light, using pulses (or alternatively a modulated signal) from a laser, and measuring the time it takes photons to travel to said target or landscape and return after reflection to a receiver in the lidar module. The reflected pulses (or modulated signals) are detected, with the time of flight and the intensity of the pulses (or modulated signals) being measures of the distance and the reflectivity of the sensed object, respectively.

Conventional lidar sensors utilize mechanically moving parts for scanning laser beams. In some systems, including certain systems used in automotive applications, such as advanced driver assist systems (ADAS) and autonomous driving systems, it is preferred to use solid state sensors for a variety of potential advantages including but not limited to higher sensor reliability, longer sensor lifetime, smaller sensor size, lower sensor weight, and lower sensor cost.

Radio frequency (RF) delay lines used for the creation of radar phased arrays were used several decades ago for the solid state steering of radar signals. Photonic integrated circuit (PIC) based delay lines combined with detectors and RF antenna arrays were used two decades ago to improve the precision of delays in the solid state steering of radar signals. PICs with microscale and nanoscale devices can be used to produce optical phased arrays (OPAs), comprising tunable optical delay lines and optical antennas, for the solid state steering of laser beams.

Phased arrays in the optical domain that are produced to date are complex, costly and/or have a different purpose than beam forming and beam steering; some combine spatial filters, optical amplifiers and ring lasers (U.S. Pat. No. 7,339,727), some involve a plurality of optical input beams (U.S. Pat. No. 7,406,220), some involve volume diffraction gratings and a plurality of input directions (U.S. Pat. No. 7,428,100), some combine beams of a plurality of wavelengths (U.S. Pat. No. 7,436,588), some have optical phase reference sources and gain elements (U.S. Pat. No. 7,489,870), some have predetermined areas in the field of view and a plurality of beam forming elements (U.S. Pat. No. 7,532,311), and some have multiple frequencies and multiple optical phase reference sources (U.S. Pat. No. 7,555,217).

Two-dimensional beam forming and steering phased arrays in the optical domain that are produced to date have low yields and are costly because they steer in two dimensions with a complex two-dimensional pixel array.

SUMMARY OF THE INVENTION

A plurality of one-dimensional (1 D) planar beam forming and steering optical phased array (OPA) chips form a two-dimensional (2D) scanning solid-state lidar, enabling manufacturing of three-dimensional (3D) mapping time-of-flight lidars at high yield and low cost resulting from the simplicity of said 1D OPA chips.

DESCRIPTION OF THE DRAWINGS

The following drawings are illustrative of embodiments of the present invention and are not intended to limit the invention as encompassed by the claims forming part of the application.

The schematic diagram of FIG. 1 depicts a plurality of 1D planar beam forming and steering optical phased array chips 10. The double-headed arrow 20 lies in the steering plane within the field of view. A graded-index (GRIN) lens 30 is used with each chip to reduce the spot size in the dimension perpendicular to the steering direction. Alternatively, a geometric refractive lens, a diffractive optical element (DOE), or a holographic optical element (HOE) could be used to achieve said spot size reduction.

Figure 1:
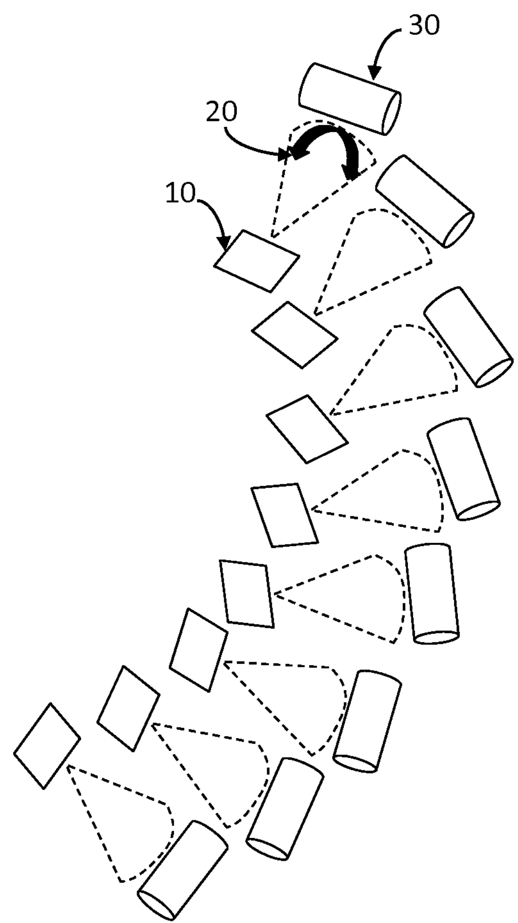
Figure 2:
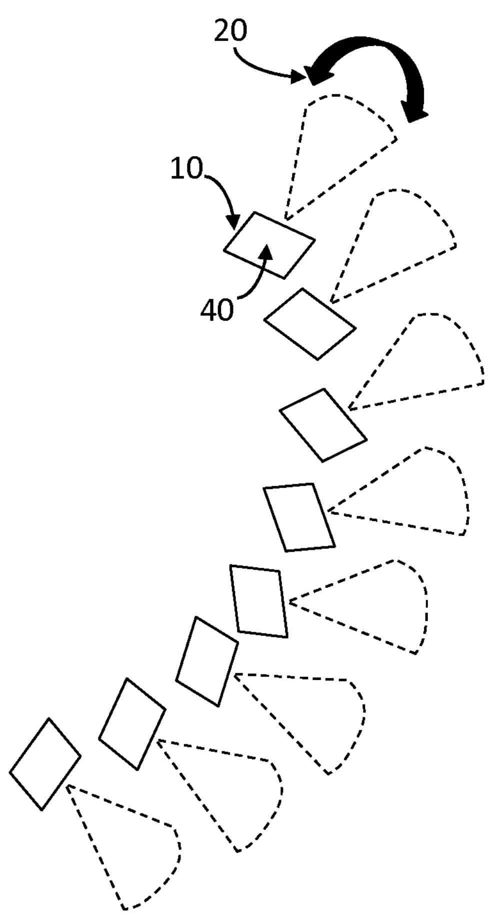

The schematic diagram of FIG. 2 depicts a plurality of 1D planar beam forming and steering optical phased array chips 10. The double-headed arrow 20 lies in the steering plane within the field of view. The spot size in the dimension perpendicular to the steering direction is reduced with an on-chip grating 40.

DETAILED DESCRIPTION OF THE INVENTION

A lidar-based apparatus and method are used for the solid state steering of laser beams using Photonic Integrated Circuits (PICS). Integrated optic design and fabrication micro- and nanotechnologies are used for the production of chip-scale optical splitters that distribute an optical signal from a laser essentially uniformly to an array of pixels, said pixels comprising tunable optical delay lines and optical antennas. Said antennas achieve out-of-plane coupling of light.

As the delay lines of said antenna-containing pixels in said array are tuned, each antenna emits light of a specific phase to form a desired far-field radiation pattern through interference of these emissions. Said array serves the function of solid state optical phased array (OPA).

By incorporating a large number of antennas, high-resolution far-field patterns can be achieved by an OPA, supporting the radiation pattern beam forming and steering needed in solid state lidar, as well as the generation of arbitrary radiation patterns as needed in three-dimensional holography, optical memory, mode matching for optical space-division multiplexing, free space communications, and biomedical sciences. Whereas imaging from an array is conventionally transmitted through the intensity of the pixels, the OPA allows imaging through the control of the optical phase of pixels that receive coherent light waves from a single source.

A plurality of one-dimensional (1 D) planar beam forming and steering optical phased array chips are simple building blocks of the transmitter in a solid-state lidar, enabling manufacturing of lidars with high yields and at low cost.

The vertical dimension (i.e., the dimension perpendicular to the steering direction) of the spot size of each said chip is reduced with at least one off-chip lens or at least one on-chip grating.

Types of said off-chip lens include but are not limited to:

Refractive lens

Graded-index (GRIN) lens

Diffractive optical element (DOE)

Holographic optical element (HOE)

Each chip containing an OPA PIC is preferably compatible with a complementary metal-oxide-semiconductor (CMOS) process.

The optical power coupled into the plurality of chips can originate from a single laser or from a plurality of lasers.

What is claimed is:

1. An apparatus, comprising:

an emitter array of one-dimensional planar beam forming and steering optical phased array photonic integrated circuit chips in a first vertical dimension, each photonic integrated circuit chip emitting optical phase controlled unmodulated pulses of coherent light waves that interfere with each other to form an optical beam pointed in a plurality of directions in a second dimension perpendicular to the first vertical dimension; and a receiver array to collect reflected pulses indicative of the distance and the reflectivity of a sensed object, the distance of the sensed object establishing a third dimension.

2. The apparatus of claim 1 further comprising at least one off-chip lens.

3. The apparatus of claim 2 wherein the off-chip lens is selected from a refractive lens, a graded index lens, a diffractive optical element and a holographic optical element.

4. The apparatus of claim 1 further comprising at least one on-chip grating.

5. The apparatus of claim 1 wherein the unmodulated pulses of coherent light waves are generated from a single laser.

6. The apparatus of claim 1 wherein the unmodulated pulses of coherent light waves are generated by a plurality of lasers, with the optical input into each photonic integrated circuit chip being generated from one of the plurality of lasers.

* * * * *